(12) United States Patent
Lai

(10) Patent No.: US 11,315,652 B1
(45) Date of Patent: Apr. 26, 2022

(54) SEMICONDUCTOR CHIP BURN-IN TEST WITH MUTLI-CHANNEL

(71) Applicant: Winbond Electronics Corp., Taichung (TW)

(72) Inventor: Chih-Chiang Lai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/953,316

(22) Filed: Nov. 19, 2020

(51) Int. Cl.
  *G01R 31/28* (2006.01)
  *G11C 29/12* (2006.01)

(52) U.S. Cl.
  CPC .... *G11C 29/12005* (2013.01); *G01R 31/2855* (2013.01)

(58) Field of Classification Search
  CPC ............ G01R 31/2856; G01R 31/2875; G01R 31/2877
  See application file for complete search history.

(56) References Cited

U.S. PATENT DOCUMENTS

| 6,353,563 | B1* | 3/2002 | Hii | ........................ | G01R 31/30 365/201 |
|---|---|---|---|---|---|
| 6,801,461 | B2* | 10/2004 | Hii | ........................ | G01R 31/30 365/201 |
| 2003/0167431 | A1* | 9/2003 | Nicolaidis | .............. | G11C 29/36 714/733 |
| 2011/0057666 | A1 | 3/2011 | Ryskoski et al. | | |

FOREIGN PATENT DOCUMENTS

| CN | 1378258 | 11/2002 |
|---|---|---|
| CN | 102376371 | 3/2012 |
| TW | 201207412 | 2/2012 |

OTHER PUBLICATIONS

"Office Action of Taiwan Counterpart Application", dated Dec. 29, 2021, p. 1-p. 6.

* cited by examiner

*Primary Examiner* — Tung X Nguyen

(74) *Attorney, Agent, or Firm* — JCIPRNET

(57) ABSTRACT

The disclosure performs a pre-test that checks electrical connections between each electrical contact of the socket and the corresponding pin of the semiconductor chip during a pre-test stage before a burn-in test. The electrical connection between each of the electrical contacts and each of the pins may be checked through multiple signal channels. Even when one of the signal channels failed, the pre-test and the burn-in test may still be performed as long as another one of the signal channels passes the pre-test. In addition, the pre-test stage through multiple signal channels also provides information for determining whether the failure of semiconductor chip is caused by the electrical connection between the socket of the burn-in board or the semiconductor chip itself.

20 Claims, 8 Drawing Sheets

SEMICONDUCTOR CHIP BURN-IN TEST WITH MUTLI-CHANNEL

BACKGROUND

Technical Field

The disclosure generally relates to a memory device, and more specifically, to a burn in test of the memory device.

Description of Related Art

In integrated circuit (IC) fabrication, discrete ICs are formed as chips (dice) on the surface of a semiconductor wafer. After the fabrication process, the wafer is scribed, and thereby dividing the wafer into the individual chips. Each chip is then packaged into modules or incorporated into larger systems. Due to defects in the wafer, or defects in one or more of the processing steps of the fabrication process, some of the individual chips may not function as designed. These defects may show up initially or may not be apparent until the chip has been in operation for a period of time. In order to identify the defective chips, a burn-in procedure is performed on the chips. During the burn-in procedure, the chips are hastened at the elevated temperature and a test controller statically or dynamically applies a set of bias voltages to selected chips so as to cause current conduction in the selected chips. For example, in a memory burn-in test, data and commands are transmitted to each individual memory chip to access memory array, so as to screen out defective chips.

In the burn-in test, each chip is inserted into a socket or a slot of a test fixture (or referred to as a burn-in board) to receive command, data, power, etc. from a test controller or a computer. These burn-in tests are usually designed to burn-in a plurality of chips connected to the same electrical bus (i.e., in parallel) to save time and costs. In some cases, the one or more socket(s) of the test fixture may be contaminated. For example, the socket may be contaminated by a particle, dirt, dust, etc. Alternatively, the contact portion of the socket may have bad connection due to wearing of the test fixture. In any cases, a contaminated connection between the memory chips and the burn-in test fixture would provide inaccurate test result. The contaminated connection in one socket may affect the rest of the sockets connected to the same electrical bus that are connected to the same signal channel of the test fixture. For example, a defective socket may short the signal channel to the ground, resulting a failure in the rest of the sockets connected to the same signal channel. Furthermore, troubleshooting the contaminated or damaged socket(s) is time consuming. With current configuration of the burn-in test, the result of the test may be unreliable and time are wasted on the troubleshooting of the test fixture.

SUMMARY

In the disclosure, a semiconductor chip is configured to perform a pre-test or a burn-in test through multiple signal channels. The pre-test is configured to check the electrical connections between each of the pins of the semiconductor chip with respect to a socket of the burn-in board or a controller of the burn-in system that executes the burn-in test.

In one of the embodiments, the semiconductor chip includes a control circuit and a plurality of pins coupled to the control circuit. The plurality of pins is configured to receive a first signal from a first signal channel through a first set of the pins and a second signal from a second signal channel through a second set of the pins. The control circuit receives and decodes the first signal and the second signal, and performs a pre-test before a burn-in test based on the first and second signals to obtain a status of electrical connections between each of the first set of the pins and the first signal channel and between each of the second set of the pins and the second signal channel.

In one of the embodiments, a semiconductor chip burn-in system comprises a burn-in device, a plurality of semiconductor chips, and a controller. The burn-in device includes a burn-in board. The burn-in board includes a plurality of sockets, where each socket includes a plurality of electrical contacts. Each of the plurality of semiconductor chips includes a control circuit and a plurality of pins coupled to the control circuit, where each of the pins is coupled to one of the electrical contacts of the socket. In addition, the controller is coupled to the plurality of semiconductor chips through the sockets of the burn-in board, and configured to transmit a first signal and a second signal to start a pre-test before a burn-in test. In the pre-test, the control circuit reconfigures the pins into a first set of the pins as a first signal channel to receive the first signal and a second set of the pins as a second signal channel to receive the second signal, and obtains a status of electrical connections between each of the first set of the pins and the corresponding electrical contact of the socket and between each of the second set of the pins and the corresponding electrical contact of the socket.

In one of the embodiments, method of testing a plurality of semiconductor chips is provided. The method includes a step of reconfiguring the plurality of pins into a first set of pins as a first signal channel to receive a first signal from the controller and a second set of pins as a second signal channel to receive a second signal from the controller. The method further includes a step of performing a pre-test before a burn-in test to determine a status of electrical connections for each of the first and second sets of the pins with respect to the controller based on the first and second signals respectively received through the first and second channels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
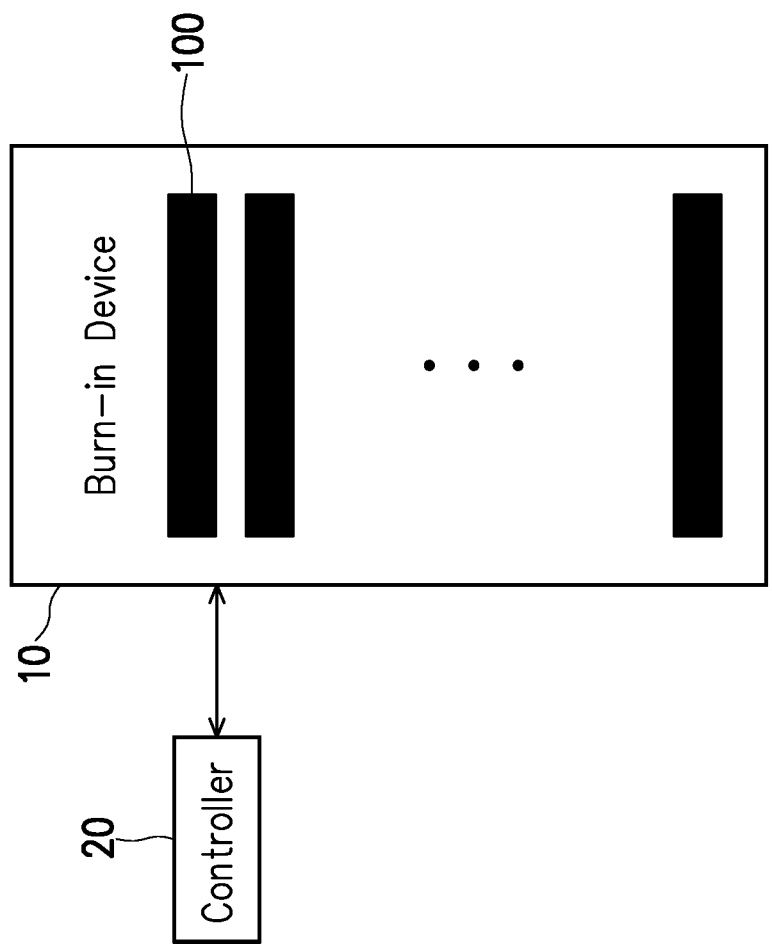
FIG. 1 is a block diagram illustrating a semiconductor chip burn-in system according to one of the embodiments of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Burn-in test is to screen the defected chips that appears after some usage. For example, a plurality of chips may be placed in a burn-in device by inserting each of the chips into a socket on a test fixture of the burn-in test device. The burn-in test device may perform the burn-in test that controls the environment while the chips is being operated. The burn-in test may stress the chips by using high or low temperature, frequent operations on the chips, etc. Taking a memory burn-in device as an example, the memory burn-in device may include 60 test fixtures (which may also be referred to as a burn-in board implemented by printed circuit board (PCB)) or any number of test fixtures, and each test fixtures may include 200 sockets or any number of sockets for placing memory chips. Each socket may include 10, 20, 30, or any number of pins that are designed to interface with a plurality of pins (or legs) of a memory chip. If any pin of the socket is contaminated, the connection between the socket and the memory chip may result in a failure of the memory chip. In addition, the contaminated connection of one socket may cause other memory chips connected to the same signal channel to have failure as well. The socket may be cleaned and burn-in test may be performed again, however it is time consuming.

In the disclosure, multiple channels (multi-channel) are provided for testing one or more given memory chip(s) connected to a test fixture of a memory burn-in test device. The concept is to configure a plurality of pins of each socket of the test fixture to form a plurality of channels for receiving test signal. In other words, each memory chip that is subjected to the burn-in test may receive test signal from multiple pathways. Under such configuration, even when one or more pin(s) of the socket is contaminated, the test signal may still be received through other pin(s) of the same socket. The test result of burn-in test would provide more information for determining whether the failure of a memory chip is due to a contaminated socket in the test fixture or the memory chip itself, as well as save time on the troubleshooting of the test fixture. Although the memory burn-in device is used as an example, the disclosure is not intended to limit the scope of the disclosure. The multiple channel configuration may be utilized for other burn-in devices such as burn-in device for performing burn-in test on microprocessor or any other integrated circuits.

FIG. 1 is a block diagram illustrating a semiconductor chip burn-in system 1 according to one of the embodiments of the disclosure. In FIG. 1, the semiconductor chip burn-in system 1 includes a controller 20 and a burn-in device 10. The controller 20 and the burn-in device 10 may be communicatively coupled to each other via cable or wirelessly, the disclosure is not intended to limit the connection therebetween. The burn-in device 10 includes a plurality of burn-in boards 100. Each of the burn-in boards 100 may include a plurality of sockets 110 configured to accommodate and provide electrical connection to a plurality of semiconductor chips 120 (may be referred to as a chip or integrated chip (IC)), respectively. Although FIG. 1 illustrates that the controller 20 and burn-in device 10 are two different components, in other embodiments, the controller 20 may be included in the burn-in device 10.

The controller 20 may include one or more processor(s) configured to instruct the burn-in device 10 for performing a burn-in test to the chip(s) 120 that is connected to the socket 110 of the burn-in board 101. The controller 20 may also include analog and digital circuits that provides signals and powers to the chip(s) 120 for performing the burn-in test.

Figure 2:
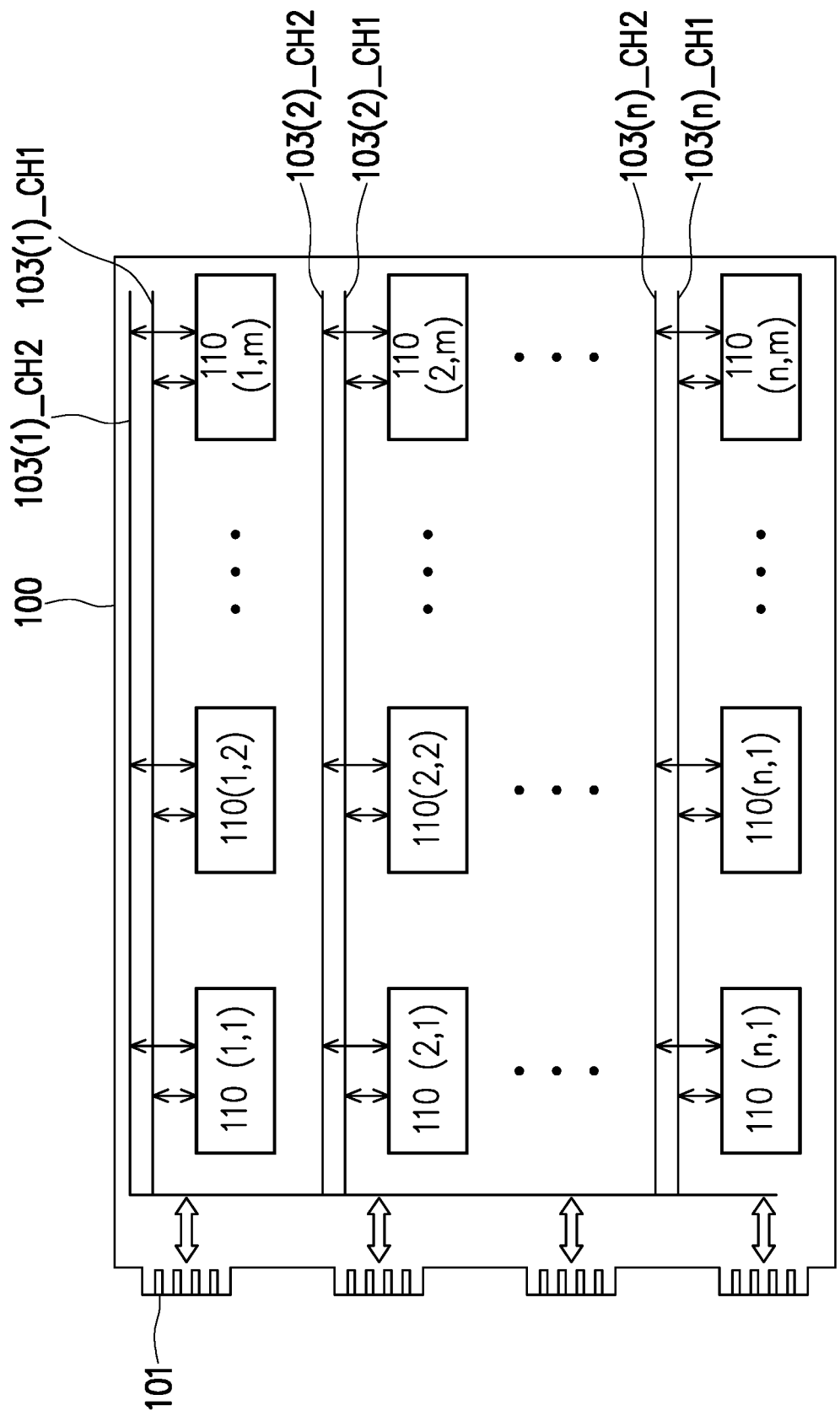
FIG. 2 is a block diagram illustrating a burn-in board of a burn-in device according to one of the embodiments of the disclosure.

FIG. 2 is a block diagram illustrating a burn-in board 100 of a burn-in device 10 according to one of the embodiments of the disclosure. The burn-in board 100 may be a printed circuit board (PCB) that includes one or more electrical connector(s) 101, a plurality of electrical buses 103(1)_CH1-103(n)_CH1, 103(1)_CH2-103(n)_CH2, and a plurality of sockets 110(1,1) thru 110(n, m) coupled to the electrical connector 101 through the electrical buses 103(1)_CH1-103(n)_CH1, 103(1)_CH2-103(n)_CH2, where n and m may be any number greater than zero. For the purpose of brevity, the socket 110 and the electrical bus 103 may be referred to as the plurality of sockets 110(1, 1) thru 110(n, m) and the plurality of electrical buses 103(1) thru 103(n) unless specified. The electrical connector 101 is configured to be disposed in the burn-in device 10 and bidirectionally communicate with the controller 20. In detail, the controller 20 may access the chip 120 connected to the socket 110 through the electrical connectors 101 and the electrical buses 103. The electrical connector 101 may be goldfinger connector or any suitable connectors such as D sub connector. RS connector, etc. In the embodiment, the electrical connector 101 is disposed in the burn-in device 10. For example, the burn-in device 10 may include a plurality of slots or connectors (not shown) that is configured to couple to the electrical connector 10, so that the controller 20 may access the chip 110 disposed on the burn-in board 100 through the electrical connector 101. Each of the electrical buses 103(1)_CH1-103(n)_CH1, 103(1)_CH2-103(n)_CH2 may be a bus having a plurality of traces, and each trace is connected to an electrical contact of the socket 110.

Figure 3:
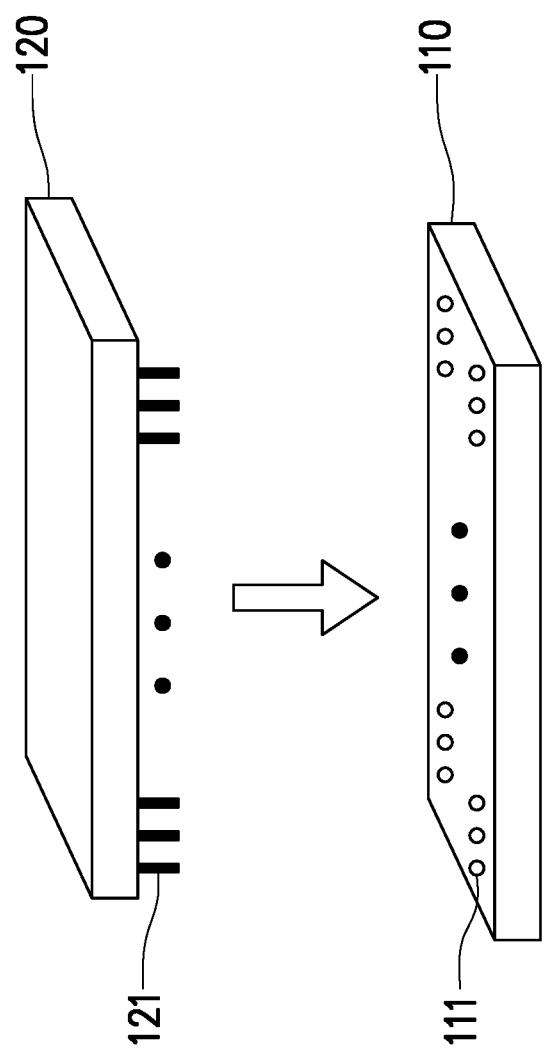
FIG. 3 illustrates a connection between the chip and the socket on the burn-in board according to one of the embodiments of the disclosure.

FIG. 3 illustrates a connection between the chip 120 and the socket 110 on the burn-in board 100 according to one of the embodiments of the disclosure. The socket 110 includes a plurality of electrical contacts 111, and the semiconductor chip 120 includes a plurality of pins (or pinout, pad, etc.) Each of the electrical contact 111 of the socket 110 is configured to couple to one of the pins 121 of the of the semiconductor chip 120 to form an electrical connection. The number of electrical contacts 111 and the number of pins 121 may include any number and may be the same or different. For example, the number of electrical contacts 111 may be greater than the number of pins 121 in some embodiments. As described above, the electrical contact 111 of the sockets 110 may be contaminated (e.g., a particle) causing a failure in the electrical connections between the socket 110 and the semiconductor chip 120. Conventionally, the socket 110 may be cleaned by air guns or any other means, and the burn-in test would have to be performed again. In contrast, in the embodiments of the disclosure, the multiple signal channels between the socket 110 and the semiconductor chip 120 may reduce the failure of the burn-in test due to the contaminated electrical contact 111 of the socket 110, since the test signal may be delivered to the semiconductor chip 120 through other signal channels.

Figure 4:
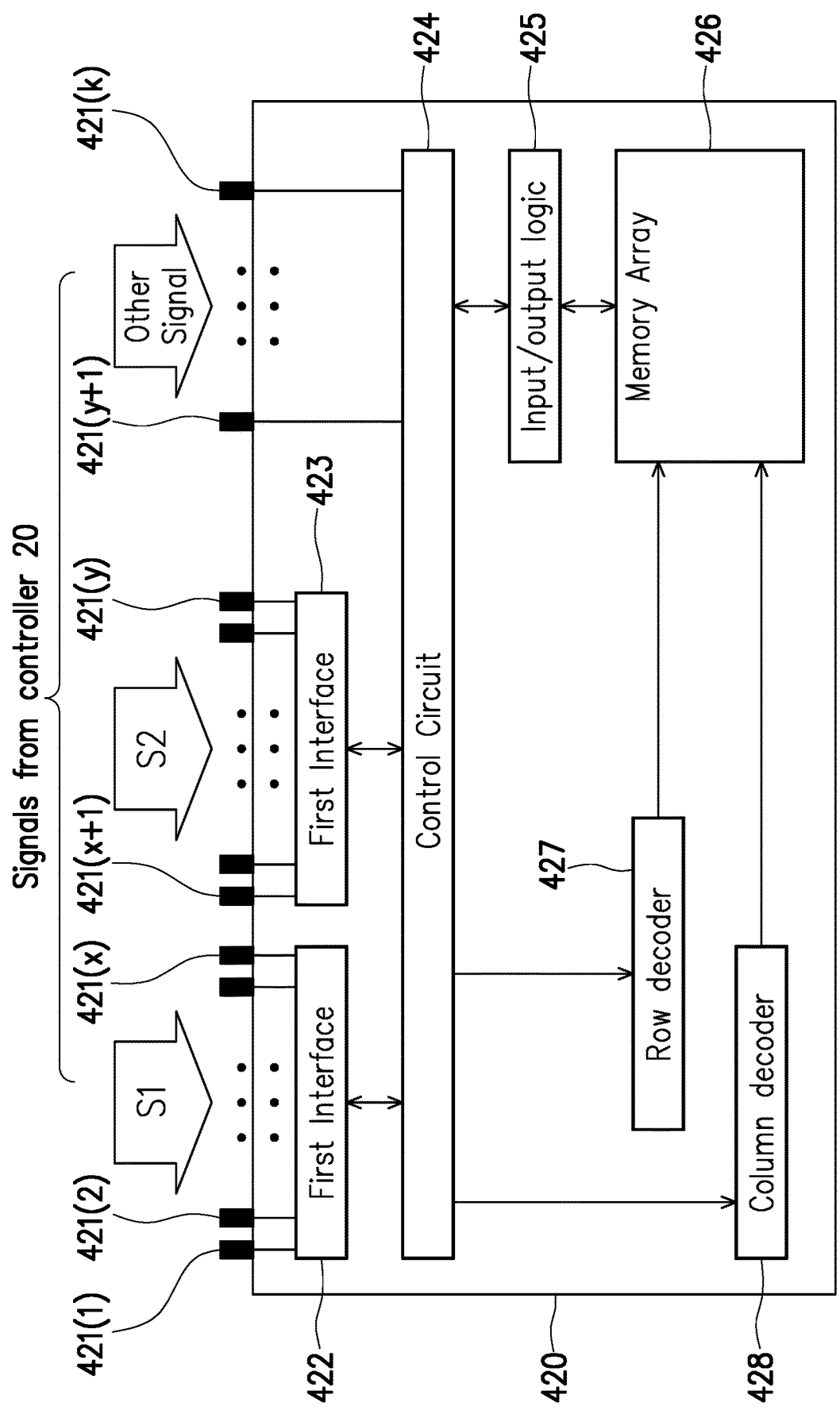
FIG. 4 is a block diagram illustrating a memory chip according to one of the embodiments of the disclosure.

FIG. 4 is a block diagram illustrating a memory chip 420 according to one of the embodiments of the disclosure. Although the memory chip is used as an example to represent the semiconductor chip 120 as described above, it is not intended to limit the disclosure. With reference to FIGS. 1, 2 and 4, the memory chip 420 may be disposed in the socket 110 of the burn-in board 100 which is disposed in the burn-in device 10. The memory chip 420 is coupled to the controller 20 and receives signals through the socket 110. In the embodiment, the signals received from the controller 20 may be control signal, data signal, and other signals (such as power signal.) In other embodiments, the power signal may be provided by a power source in the burn-in device 10, the disclosure is not intended to limit the source of the power signal.

In the embodiment, the memory chip 420 includes a plurality of pins 421(1)-421(k), a first channel interface 422, a second channel interface 423, a control circuit 424, a memory array 426, a row decoder 427, and a column decoder 428. The plurality of pins 421(1)-421(k) are configured to receive and transmit signals, where k is greater than zero. The pins 421(1)-421(k) may be directly or indirectly coupled to the control circuit 424. In the embodiment, the pins 421(1)-421(x) are coupled to the control circuit 424 through the first interface 422, and the pins 421(x+1)-421(y) are coupled to the control circuit 424 through the second interface 423, where y is a positive real number greater than x and less than k. Although the embodiment shows that the pins 421(y+1)-421(k) are coupled to the control circuit 424 directly, the disclosure is not limited thereto. In other embodiments, the pins 421(y+1)-421(k) may be coupled to the control circuit 424 through an interface (not shown.)

The control circuit 424 is coupled to the input/output logic 425, the row decoder 427, and the column decoder 428 to store and extract data into and from the memory array 426. The memory array 426 includes a plurality of memory cells arranged in a matrix. The control circuit 424 is configured to decodes the signal received from the pins 421(1)-421(k), the signals may include commands, data, etc. For example, the control circuit 424 decodes address to be accessed based on the signal received from the pins 421(1)-421(k). The control circuit 424 transmits the data of the received signal to the input/output logic 425 and the row and column addresses to the row and column decoders 427, 428 for accessing the memory array 426. In the embodiment, the control circuit 424 is configured to identify a command signal from the controller 20 that instructs the memory chip 420 to enter a pre-test mode. The command signal may include an entry code that toggles each of the pins 421(1)-421(y) of the signal channels in sequence (i.e., signal toggling), which would be described in detail later.

In the embodiment, the pins 421(1)-421(y) are configured to receive test signal from the controller 20 as multiple signal channels. In detail, multiple signal channels are formed by configuring a portion of pins 421(1)-421(x) of the memory chip 420 (i.e., first portion of the plurality of pins) as a first signal channel to receive a first test signal S1 and another portion of pins 421(x+1)-421(y) of the memory chip 420 (i.e., second portion of the plurality of pins) as a second signal channel to receive a second test signal S2. The number of pins that forms the first signal channel (e.g., the pins 421(1)-421(x)) may be the same as the number of pins that forms the second signal channel (e.g., the pins 421(x+1)-421(y)), and the first and second test signals SL, S2 may be the same or different. The pins 421(y+1)-421(k) are configured to receive or transmit other signals between the memory chip 420 and the controller 20 (or other devices external to the memory chip 420). The other signals may include power signal, output signals of the memory chip 420, and any other control signals. The power signal may be provided by the controller 20 or the burn-in device 10. The output signals may be feedback signal from the control circuit 424 in response to the test signals S1. S2. Although the embodiment shows the first and second channels only, it should be noted that more signal channels may be formed by reconfiguring the functionality of the pins 421(1)-421(k).

The multiple signal channel configuration is to avoid the problem of contaminated electrical contact 1 on the sockets 110 of the burn-in board 100. For example, the electrical connection between the electrical contact 111 of the sockets 110 and one of the pins 421(1)-421(x) configured to be the first signal channel is contaminated. The first signal channel would not be able to receive the entire first test signal. With memory chips that only has one signal channel (i.e., conventional configuration), such situation would cause failure in the burn-in test. However, in the embodiment, the pins 421(x+1)-421(y) would still receive the second test signal S2 to complete the pre-test as well as the burn-in test. The functionality of the memory chip 420, such as accessing the memory array 426, may be burn-in or stressed through the second signal channel. In other words, the stress test of the memory chip 420 during the burn-in test may be executed by burn-in test signals received by either the first or second signal channel. The burn-in test signals received by the first and second signal channels may be the same or different. Therefore, user may clean the contaminated electrical contact 111 of the socket 110 during the pre-test stage or allow the memory chip disposed on the burn-in board 110 to continue to the burn-in test stage.

Figure 5:
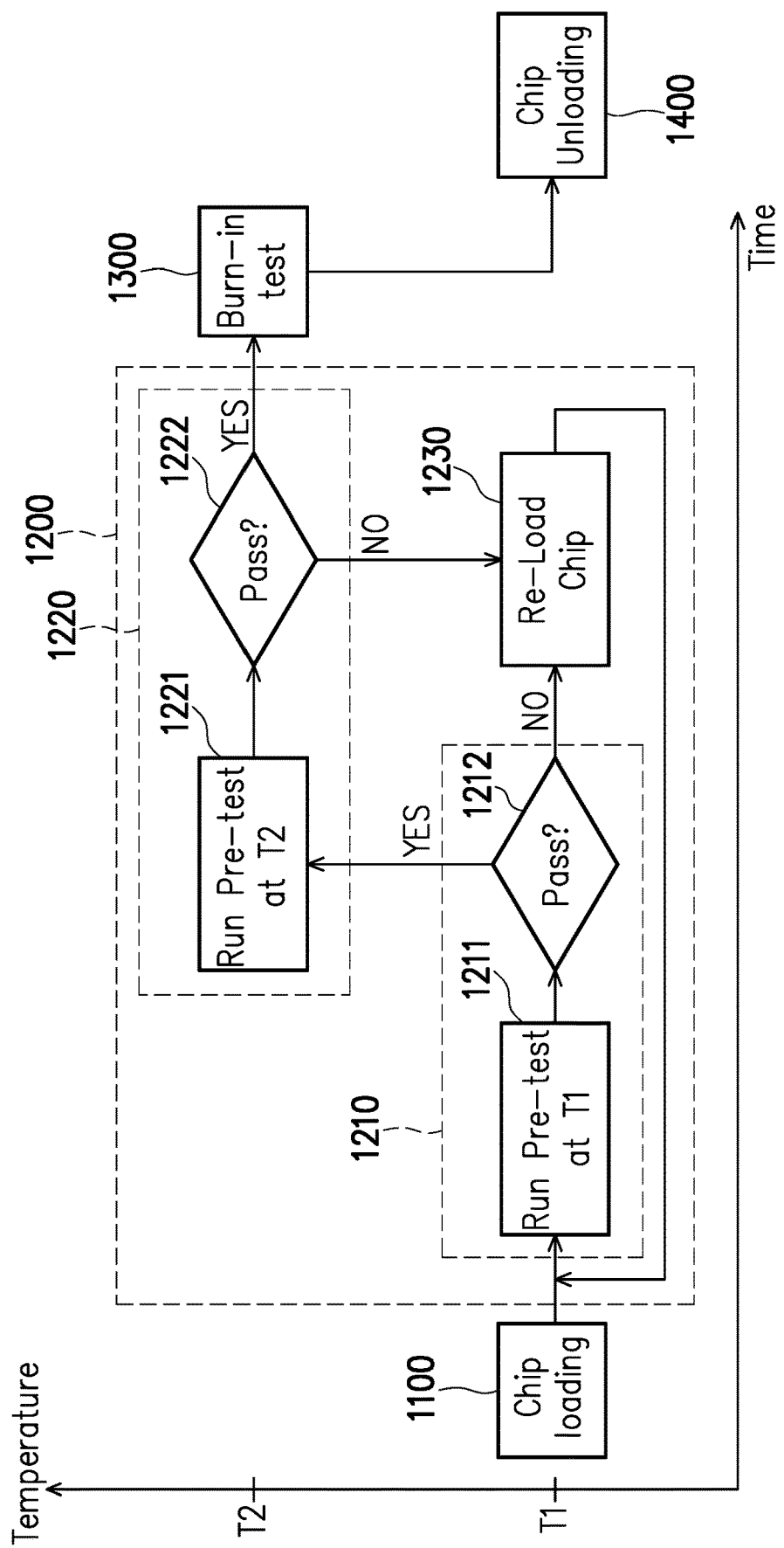
FIG. 5 is a process flow diagram illustrating a process of a semiconductor chip burn-in test according to one of the embodiments of the disclosure.

FIG. 5 is a process flow diagram illustrating a process of a semiconductor chip burn-in test according to one of the embodiments of the disclosure. FIG. 5 includes x-axis representing time and y-axis representing a temperature for illustrating various stages of the semiconductor chip burn-in test. The burn-in test process includes a chip loading stage 1100, a pre-test stage 1200, a burn-in test stage 1300, and a chip unloading stage 1400. In the embodiment, the chip loading stage 1100, a part of the pre-test stage 1200, and the chip unloading stage 1400 are performed at a first temperature T1 which may be an ambient temperature of a room. Another part of the pre-test stage 1200 and the burn-in test stage are performed at a second temperature T2 which may be a temperature controlled by the burn-in device 10. For example, the burn-in device 10 may be controlled to heat the internal compartment that contains the burn-in boards to a designed burn-in temperature such as 40-150 degrees Celsius or any other desired temperature. In the load chip stage 1100, the plurality of semiconductor chips 120 are being loaded onto the plurality of the sockets 110 of the burn-in board 100. The plurality of the burn-in boards 100 each having the plurality of the semiconductor chips 120 may be inserted or plugged into burn-in device 10 for performing the burn-in test on a batch of the semiconductor chips. The batch of the semiconductor chips is referred to as the semiconductor chips that are disposed on the plurality of the burn-in boards 100 and to be tested during the same period.

In the pre-test stage 1200, the electrical connection between the socket 110 and the semiconductor chip 120 are checked before the burn-in test stage 1300. The pre-test stage 1200 includes a first pre-test 1210, a second pre-test 1220 and a chip reload step 1230. In the embodiment, the first pre-test 1210 and the chip reload step 1230 are performed at the first temperature, and the second pre-test 1220 is performed at the second temperature. After the chip loading stage 1100, the controller 20 instructs the burn-in test device 10 to run the first pre-test in step 1211 and determines whether the electrical connection between the semiconductor chip 120 and the socket 110 of the burn-in board 110 passes the first pre-test in step 1212. If the first pre-test 1210 is passed, the process would go to the second pre-test at the second temperature 1220 (i.e., "Yes" path out of the step 1212). If the first pre-test 1210 failed (i.e., not pass), the process would go to the chip reload step 1230 (i.e., "No" path out of the step 1212).

In the chip reload step 1230, the semiconductor chips 120 are reloaded onto the sockets 110. For example, the semiconductor chips may be unplugged from the sockets 110 for cleaning the electrical contact 111 of the sockets 110 and/or the pins 121 of the semiconductor chips 120. Then, the semiconductor chips 120 may be reloaded onto the sockets 110. The process would then return to the first pre-test stage 1210 to re-test the electrical connections at the first temperature T1. The first pre-test stage 1210 may produce a test result that indicates which burn-in board 100 and/or which sockets 110 did not pass the first pre-test 1210, so that the cleaning of the sockets and reloading of the semiconductor chips may be confined to the problematic section.

When the batch of semiconductor chips passes the first pre-test stage 1210, the process goes to the second pre-test stage 1220. Similar to the first pre-test stage 1210, the second pre-test stage 1220 includes a step 1221 of performing a second pre-test at the second temperature T2 and a step 1222 of determining whether the batch of the semiconductor chips passes the second pre-test at the second temperature T2. If the batch of the semiconductor chips fails the second pre-test (i.e., "No" path out of the step 1222), the process would go to the chip reload step 1230. If the batch of the semiconductor chips passes the second pre-test (i.e., "Yes" path out of the step 1222), the process would go to the burn-in test stage 1300 to perform the burn-in test on the batch of the semiconductor chips.

After the burn-in test stage 1300, the process would go to the chip unload stage 1400, where the semiconductor chips 120 would be unloaded from the burn-in boards 100. The result of the burn-in test performed during the burn-in test stage 1300 would be provided to screen the defective chip that appears after some usage.

In the following the pre-test performed during the first and second pre-tests 1210, 1220 in the pre-test stage 1200 would be described in detail. One of the purposes of the pre-test is to identify any communication failure between the socket 110 of the burn-in board 100 and the semiconductor chip 120. As described above, a particle on the socket 110 may cause a communication failure due to defective electrical connection between the socket 110 and the semiconductor chip 120. The defective electrical connection may be misinterpreted as a failure of the semiconductor chips 120 after the burn-in test. In such case, the burn-in test may be performed again on the semiconductor chips that failed the burn-in test. In the embodiment, the pre-test stage 1200 may identify the defective electrical connection before the burn-in test, so that the burn-in test does not have to be performed again. The pre-test stage may take 2-10 hours to complete, while the burn-in test may have a burn-in time that is several times of the amount of time the pre-test would take. Therefore, it is desired to catch the defective electrical connection in the pre-test stage 1200 before the burn-in test stage 1300.

Figure 6:
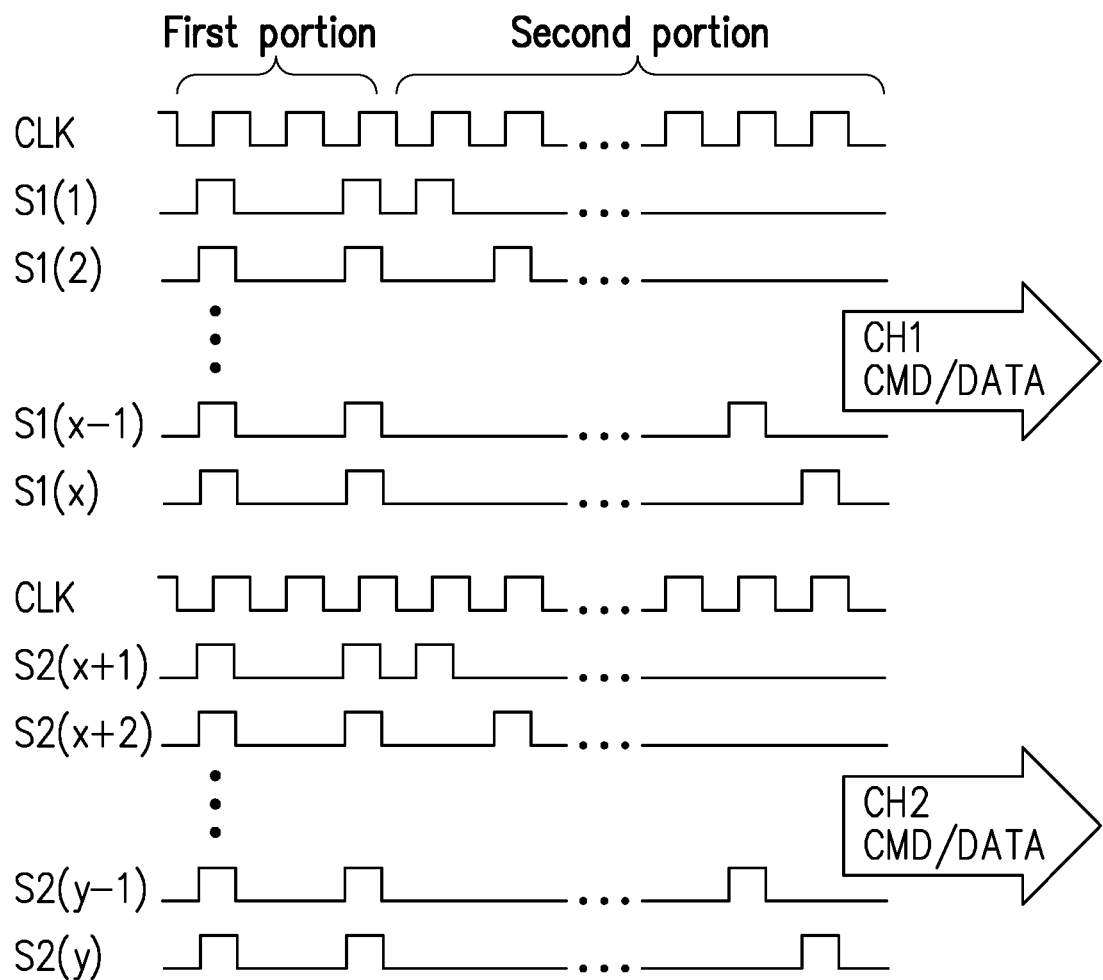
FIG. 6 is a timing diagram illustrating a test signal of a pre-test according to one of the embodiments of the disclosure.

FIG. 6 is a timing diagram illustrating a test signal of a pre-test according to one of the embodiments of the disclosure. The testing signal includes an entry code that toggles the pins of the memory chip in a sequential order for instructing the memory chips 421 to enter a test mode. After the entry code, command and data of the test signal may be transmitted to the memory chip for accessing the memory chip. In FIG. 6, signals S1(1)-S1(x) represent signals of the first channel (CH1), and signals S2(x+1)-S2(y) represent signals of the second channel (CH2). The signals S1(1)-S1(x), S2(x+1)-S2(y) are transmitted from the controller to each of the pins 421(1)-421(y) of the memory chips with respect to a clock CLK. The entry code includes a first portion that toggles every pins 421(1)-421(y) simultaneously twice with one or more clock cycle(s) apart. The entry code also includes a second portion that toggles each of the pins 421(1)-421(y) of the memory chip 421 per clock cycle in a sequential order, which may also be referred to as a signal toggling of individual pin. The signal toggling of individual pin or toggling of any pin refers to a signal that transits between low and high for one clock cycle. From FIG. 6, the signal toggling of individual pin is performed on the first channel (CH1) and the second channel (CH2), respectively. For example, the first signal S1(1) of the first channel (CH1) would be toggled during the same clock cycle as the first signal S2(x+1) of the second channel (CH2), and so on. In other embodiments, the signal toggling of individual pin may include other patterns rather than the sequence as illustrated in FIG. 6. For example, the first pin connected to the first signal channel (or the second signal channel) may be toggled first, and then followed by the signal toggling of the last pin connected the first signal channel (or the second signal channel). The rest of the pins connected to the first signal channel (or the second signal channel) may be toggled in any order. In yet other embodiments, the pins connected to the first and second signal channels may be toggled in a random order, respectively.

Although FIG. 6 shows that the test signal of pre-test stage includes the entry code, the command and data, the disclosure is not intended to limit thereto. In other embodiments, the entry code is sufficient to show that the electrical connection between the electrical contact 111 of the socket 110 and the pin 421 of the memory chip 420 involved in the signal toggling. Therefore, the test signal of the pre-test may only contain the entry code for determining whether the electrical connection between the socket and the memory chip is established for a subsequent test such as the burn-in test.

Figure 7:
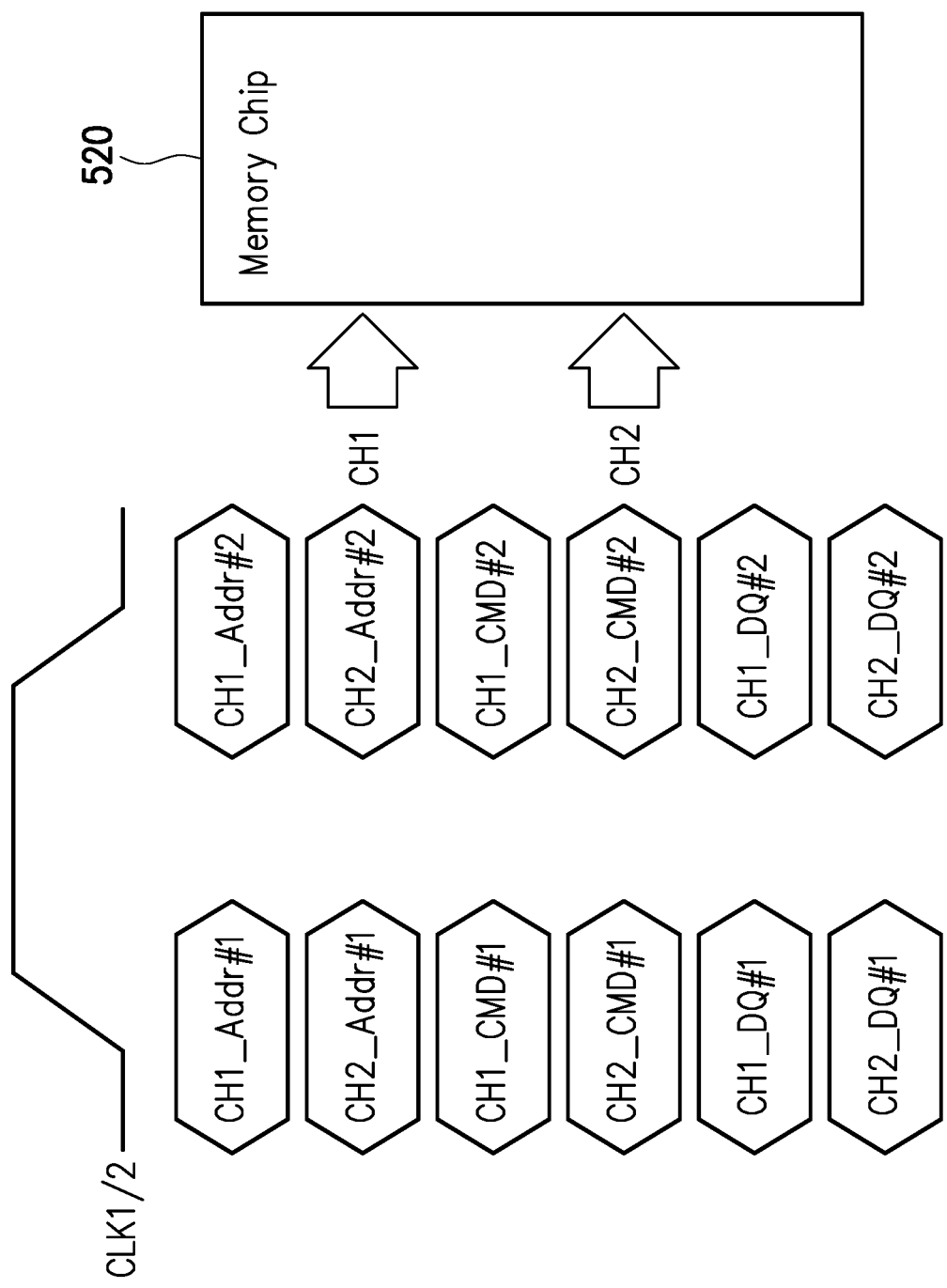
FIG. 7 is a diagram illustrating a transmission of an input signal from the controller to the memory chip according to one of the embodiments of the disclosure.

The test signal for instructing each memory chip to enter the test mode is being transmitted from the controller 20 to each memory chip 420 disposed in the socket 110 through the electrical buses 103(1)-103(n) of the burn-in board 100. FIG. 7 is a diagram illustrating a transmission of an input signal from the controller 20 to the memory chip 420 according to one of the embodiments of the disclosure. In the embodiments, the number of pins for transmitting test signal is reduced for creating multiple signal channels, so as to avoid inaccurate burn-in test result due to a contaminated electrical connection between the socket of the burn-in board and the pin of the memory chip. For example, if a memory chip originally has 20 pins for receiving an input signal to run test on the memory chip, the embodiments would reduce the number of pins in order to create multiple signal channel. In a case of the memory chip having 20 pins (i.e., pin counts), the embodiment as illustrated in FIGS. 2 and 4 would split the 20 pins into 2 signal channels, where each signal channel would utilize 10 pins for transmitting the input signal. Since the amount of data of the input signal would be the same before and after the multiple signal channel configuration, the input signal would be transmitted and/or received in a time division manner. For example, address of the input signal may require all 20 pins to transmit, conventionally. With the multiple signal channel configuration, only 10 pins are assigned to a signal channel. In the embodiment, the address of the input signal is divided into a first address (Addr #1) and a second address (Addr #2), where the first address is transmitted at the rising edge of a clock cycle and the second is transmitted at the falling edge of the same clock cycle. Similar technique is used for transmitting command (CMD #1. CMD #2) and data (DQ #1, DQ #2) of the first and second signal channels (CH1, CH2.) The disclosure is not limited to the reduced pin counts (RPC) technique above, other RPC technique may be adapted to the embodiments of the disclosure.

It should be noted that the memory chip 420 is used in some of the embodiments above to illustrate the concept of the disclosure, however, all of the description related to the memory chip 420 may also be applied to the semiconductor chip 120 as illustrated in FIGS. 1-3.

Figure 8:
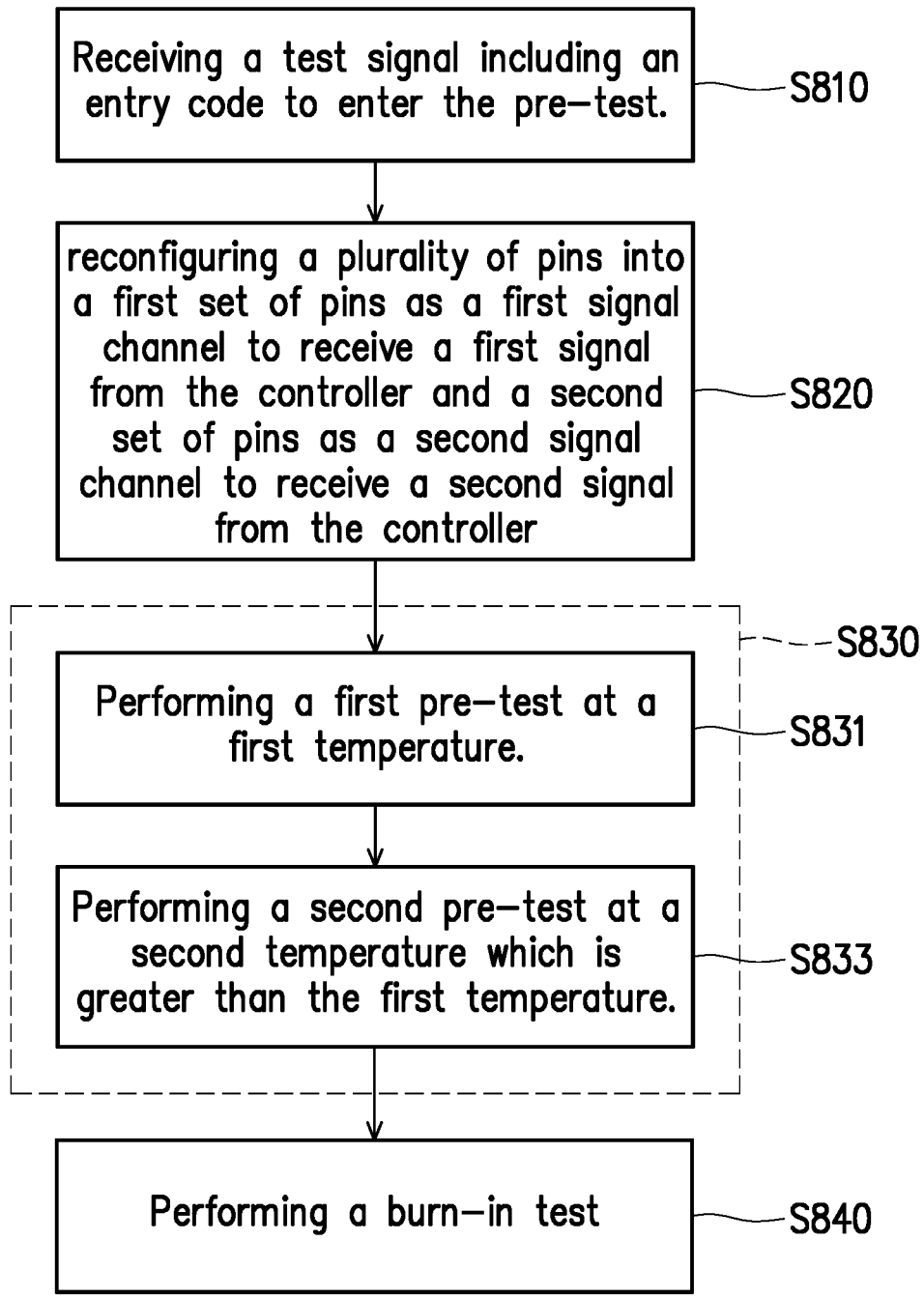
FIG. 8 is a diagram illustrating a register file read/write control unit 850 according to some embodiments of the disclosure.

FIG. 8 is a flow diagram illustrating testing of a plurality of semiconductor chips according to one of the embodiments of the disclosure. In step S810, test signal including an entry code is received from the controller. Upon receiving of the test signal, in step S820, the control circuit of the semiconductor chip enters the test mode and reconfigures a plurality of pins into a first set of pins as a first signal channel to receive a first signal from the controller and a second set of pins as a second signal channel to receive a second signal from the controller. In step S830, a pre-test before a burn-in test is performed as to determine a status of electrical connections for each of the first and second sets of the pins with respect to the controller.

In the embodiment, the pre-test of step S830 includes a first pre-test and a second pre-test. In step S831, the first pre-test is performed by toggling each of the pins through the first signal channel and the second signal channel while the semiconductor chip is disposed in an environment having a first temperature (e.g., ambient temperature.) The first pre-test determines at least one of the first or second signal channel passes the test (also see 1210 illustrated in FIG. 5). If no, the semiconductor chips may be reloaded onto the sockets of the burn-in board and the first pre-test may be performed again (also see 1230 illustrated in FIG. 5.) If yes, the process goes to the second pre-test in step S833, where the environment is changed to a second temperature which may be higher or lower than the first temperature. The second pre-test determines whether at least one of the first or second signal channel passes the test. If no, the environmental temperature of the semiconductor chips may be changed back to the ambient temperature, and the semiconductor chips may be reloaded onto the sockets of the burn-in board. Then, the pre-test would be performed again from the first pre-test in step S831. However, the disclosure is not intended to limited thereto. In other embodiments, the process may go back to the beginning of the second pre-test in step S833 after the reloading of the semiconductor chips. It should also be noted that the semiconductor chips reload may be referring to the reloading of semiconductor chips having an electrical connection issue as identified by the first and second pre-test. If the semiconductor chips pass the second pre-test in step S833, the process goes to step S840 to perform the burn-in test.

Based on the above, the disclosure may quickly test the electrical connection between a plurality of electrical contact of the socket and a plurality of pins of the semiconductor chip during a pre-test stage before a time-consuming burn-in test stage. In detail, the electrical connection between each of the electrical contacts and each of the pins may be checked through multiple signal channels. Even when one of the signal channels failed, the pre-test and the burn-in test may still be performed as long as another one of the signal channels passes the pre-test. In addition, the pre-test stage through multiple signal channels also provides information for determining whether the failure of semiconductor chip is caused by the electrical connection between the socket of the burn-in board or the semiconductor chip itself.

What is claimed is:

1. A semiconductor chip, comprising:
a plurality of pins, receiving a first signal from a first signal channel through a first set of the pins and a second signal from a second signal channel through a second set of the pins; and
a control circuit, receiving and decoding the first signal and the second signal, performing a pre-test before a burn-in test based on the first and second signals to obtain a status of electrical connections between each of the first set of the pins and the first signal channel and between each of the second set of the pins and the second signal channel.

2. The semiconductor chip of claim 1, wherein the control circuit is further configured to receive a burn-in test signal for performing the burn-in test when one of the first set or second set of the pins passes the pre-test.

3. The semiconductor chip of claim 1, wherein the first and second signals are identical.

4. The semiconductor chip of claim 1, wherein the first and second signals each includes an entry code for instructing the control circuit to enter the pre-test, wherein the entry code includes signal toggling of individual pin in the first and second sets of the pins.

5. The semiconductor chip of claim 4, wherein the signal toggling of individual pin toggles each of the first and second sets of the pins in a sequential order, respectively.

6. The semiconductor chip of claim 4, wherein the signal toggling of individual pin toggles each of the first and second sets of the pins in a random order, respectively.

7. The semiconductor chip of claim 1, wherein, when performing the pre-test, the control circuit reconfigures the plurality of pins into the first set of pins for receiving the first signal from the first signal channel and the second set of pins for receiving the second signal from the second signal channel.

8. The semiconductor chip of claim 1, wherein the pre-test includes a first pre-test at a first temperature and a second pre-test performed at a second temperature, wherein the second temperature is greater than the first temperature.

9. A semiconductor chip burn-in system, comprising:
a burn-in device having a burn-in board, wherein the burn-in board includes a plurality of sockets, each socket includes a plurality of electrical contacts;
a plurality of semiconductor chips, each including a control circuit and a plurality of pins coupled to the control circuit, wherein each of the pins is coupled to one of the electrical contacts of the socket; and
a controller, coupled to the plurality of semiconductor chips through the sockets of the burn-in board, transmitting a first signal and a second signal to start a pre-test before a burn-in test,
wherein, in the pre-test, the control circuit reconfigures the pins into a first set of the pins as a first signal channel to receive the first signal and a second set of the pins as a second signal channel to receive the second signal, and obtains a status of electrical connections between each of the first set of the pins and the corresponding electrical contact of the socket and between each of the second set of the pins and the corresponding electrical contact of the socket.

10. The semiconductor chip burn-in system of claim 9, wherein the control circuit is further configured to receive a burn-in test signal for performing the burn-in test when one of the first set or second set of the pins passes the pre-test.

11. The semiconductor chip burn-in system of claim 9, wherein the first and second signals are identical.

12. The semiconductor chip burn-in system of claim 9, wherein the first and second signals each includes an entry code for instructing the control circuit to enter the pre-test, wherein the entry code includes signal toggling of individual pin in the first and second sets of the pins.

13. The semiconductor chip burn-in system of claim 11, wherein the signal toggling of individual pin toggles each of the first and second sets of the pins in a sequential order, respectively.

14. The semiconductor chip burn-in system of claim 11, wherein the signal toggling of individual pin toggles each of the first and second sets of the pins in a random order, respectively.

15. The semiconductor chip burn-in system of claim 11, wherein the pre-test includes a first pre-test at a first temperature and a second pre-test performed at a second temperature, wherein the second temperature is greater than the first temperature.

16. A method of testing a plurality of semiconductor chips, wherein the semiconductor chip includes a control circuit and a plurality of pins coupled between a control circuit and a controller external to the semiconductor chips, comprising:
reconfiguring the plurality of pins into a first set of pins as a first signal channel to receive a first signal from the controller and a second set of pins as a second signal channel to receive a second signal from the controller; and
performing a pre-test before a burn-in test to determine a status of electrical connections for each of the first and second sets of the pins with respect to the controller based on the first and second signals respectively received through the first and second channels.

17. The method of claim 16, further comprising receiving a burn-in test signal for performing the burn-in test when one of the first set or second set of the pins passes the pre-test.

18. The method of claim 16, wherein the first and second signals each includes an entry code for instructing the control circuit to enter the pre-test, wherein the entry code includes signal toggling of individual pin in the first and second sets of the pins, and the first and second signals are identical.

19. The method of claim 16, wherein the signal toggling of individual pin toggles each of the first and second sets of the pins in a sequential order, respectively.

20. The method of claim 16, wherein the pre-test includes a first pre-test at a first temperature and a second pre-test performed at a second temperature, wherein the first pre-test determine the status of electrical connections for each of the first and second sets of the pins with respect to the controller at the first temperature, and the second pre-test determine the status of electrical connections for each of the first and second sets of the pins with respect to the controller at the second temperature, wherein the second temperature is greater than the first temperature.

* * * * *